United States Patent [19]

Yizraeli

[11] Patent Number: 5,362,996
[45] Date of Patent: Nov. 8, 1994

[54] STAGGERED OUTPUT CIRCUIT FOR NOISE REDUCTION

[75] Inventor: Yehuda Yizraeli, Yokne'am, Israel

[73] Assignee: Intel Corporation, Santa Clara, Calif.

[21] Appl. No.: 896,673

[22] Filed: Jun. 10, 1992

[51] Int. Cl.⁵ .................... H03K 17/16; H03K 5/13
[52] U.S. Cl. ........................ 326/27; 326/57; 327/384
[58] Field of Search .............. 307/443, 473, 592, 594, 307/480, 269, 481

[56] References Cited

U.S. PATENT DOCUMENTS

| | | | |
|---|---|---|---|
| 4,616,142 | 10/1986 | Upadhyay et al. | 307/296.1 |
| 4,820,942 | 4/1989 | Chan | 307/443 |
| 4,857,765 | 8/1989 | Cahill | 307/443 |
| 5,136,185 | 8/1992 | Fleming et al. | 307/473 |
| 5,196,743 | 3/1993 | Brooks | 307/443 |

*Primary Examiner*—Edward P. Westin
*Assistant Examiner*—Andrew Sanders
*Attorney, Agent, or Firm*—Blakely, Sokoloff, Taylor & Zafman

[57] ABSTRACT

A method of reducing voltage spikes on voltage supply lines of an integrated circuit having a plurality of data signal lines each coupled to a tristate output buffer. The voltage spikes are reduced by enabling and disabling output buffers one at a time such that no two buffers become enabled or disabled simultaneously and by providing a different prespecified delay to each of the plurality of data signal lines so that no two output buffers are toggled simultaneously.

3 Claims, 4 Drawing Sheets

STAGGERED OUTPUT CIRCUIT FOR NOISE REDUCTION

FIELD OF THE INVENTION

The present invention relates to Integrated circuit design, and more specifically, to a method and apparatus for reducing voltage spikes on power supply lines due to output buffer toggling.

PRIOR ART

It is well known in the art that when data buffers of an integrated circuit are toggled, spikes are created on power supply lines on the die such as Vcc and Vss. Spikes are caused by the di/dt phenomenon. That is, the charging and discharging of output loads generate voltage spikes on die power supply lines $V_{CC}$ and $V_{SS}$. These spikes are enlarged when all output buffers are toggled simultaneously.

Large voltage spikes on power supply lines of an integrated circuit can cause substantial reliability problems. For instance, the spikes can cause false indications that signals are being passed on input/output signal lines of the chip, such as READ, WRITE, and CHIP SELECT. This is especially troublesome for asynchronous chips which are triggered by signals being placed on their input pins. Additionally voltage spikes on power supply lines can cause a chip to misread signals on its input pins.

There are presently a couple of different ways to solve the problem of voltage spikes. One method is to simply slow down the output stage or output buffer of the circuit. That is, one can operate the chip at a lower frequency. This is of course undesirable because speed is lost and performance is decreased. In modern electronics chips must be able to operate reliably at high frequencies.

Another method of solving the voltage spike problem is to provide a package with extra pairs of power pins (Vcc and Vss). Such a technique, however, is undesirable because package costs is directly related to pin count. Extra power supply pins on a package translates into extra cost for the product. Additionally, many existing electronic systems are pin compatible with packages having lower pin counts. These systems cannot use new, faster chips unless the new chips can be placed in the old packages with lower pin counts and operate reliably therein. In these situations, therefore, the problem cannot be simply solved by providing additional power supply pins with the package. The faster chip must be able to reliably operate in a low pin count package.

Thus, what is needed is a method of reducing voltage spikes on voltage supply lines without degrading performance of the chip and without increasing pin count of the package containing the chip.

SUMMARY OF THE INVENTION

An apparatus for reducing noise spikes in voltage supply lines of an integrated circuit during the toggling of output buffers is described. A data bus provides eight data signal lines. A data signal line delay circuit is coupled to each data signal line. Each data signal line delay circuit along with the inherent line capacitance of the data signal line provide a different amount of delay for each data signal. A tristate output buffer is coupled to each data signal line. No two output buffers receive data simultaneously so that no two buffers toggle simultaneously. Each of the output buffers is enabled and disabled by an enable signal line. An enable delay circuit is provided with each output buffer. The enable delay circuits are serially coupled to the enable signal line so that no two buffers become enable or disabled simultaneously. The apparatus also includes a sensing circuit to signal when the enable delay circuits and the data signal delay circuits are to be enabled. This feature gives the apparatus dual operating modes. One mode disables the "staggering" when the chip is contained in a high pin count package having multiple power pins, and the other mode enables the "staggering" when the chip is contained in a package having a reduced number of power pins.

A goal of the present invention is to reduce noise spikes on power supply lines during the toggling of output buffers.

A goal of the present invention is to reduce voltage spikes on power supply lines of a chip without slowing the operating frequency of the chip and without adding additional pairs of power supply pins.

Another goal of the present invention is to provide a versatile circuit with two modes of operation: one mode wherein the circuit toggles output buffers in a staggered fashion for those situations when the chip is contained in a package with a reduced number of power pins; and a second mode in which output buffers are toggled simultaneously for those situations when the chip is contained in a package having multiple power pin pairs and voltage spikes are not a problem.

Yet another goal of the present invention is to be able to provide new generations of a chip which can operate at higher frequencies than older versions but which are also still pin compatible with older chips.

Still yet another goal of the present invention is to reduce pin count in integrated circuit packages by reducing the number of power pins required for noise reduction, thereby reducing package cost.

Other features and advantages of the staggered output circuit of the present invention will become apparent in the detailed description which follows.

DETAILED DESCRIPTION OF THE PRESENT INVENTION

The present invention describes a method and apparatus for reducing voltage spikes on power supply lines of an integrated circuit. In the following description, numerous specific details are set forth, such as specific delay circuits, etc. in order to provide a more thorough understanding of the present invention. It will be obvious, however, to one skilled in the art that the present invention may be practice without these details. In other instances, well-known circuit design principles have not been described in detail in order to not unnecessarily obscure the present invention.

The present invention is a novel method and apparatus for reducing voltage spikes on power supply lines of a chip which develop during the simultaneous toggling of output buffers. Simultaneous toggling of output buffers occurs at basically two times: when output buffers simultaneously become enabled or disabled (i.e., go from the tristate to an active low or an active high state); and when the output buffers simultaneously change state (i.e., go from an active low state to an active high state or go from an active high state to an active low state). The present invention reduces voltage spikes by providing different delays on each data line and by providing different delays on each buffer enable line so that no two buffers are toggled simultaneously. That is, the output buffers are toggled in a staggered manner, one after the other. The staggered output circuit of the present invention has two modes of operation: one mode wherein the circuit toggles output buffers in a staggered manner and a second mode wherein the staggering is disabled, and output buffers are toggled simultaneously.

Figure 1:
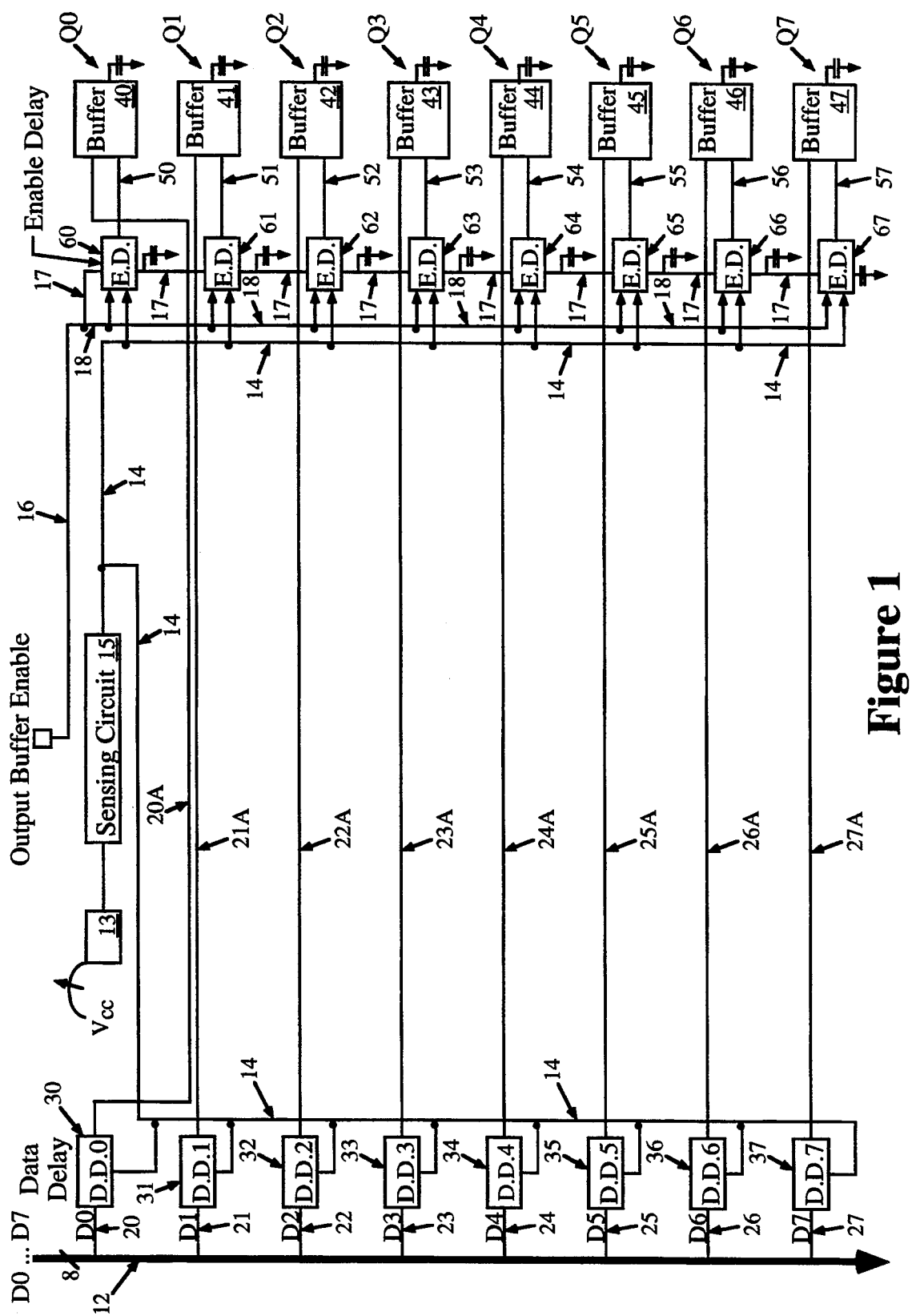
FIG. 1 is the dual mode staggered output circuit of the present invention.

FIG. 1 illustrates the staggered output circuit of the present invention. An eight bit data bus 12 provides data signals D0–D7 on eight data signal lines 20–27. Each data signal line, 20–27, is coupled to a different data delay circuit 30–37 respectively. Each data delay circuit, 30–37, is coupled via a delay enable line 14 to a sensing circuit 15. Each data signal line, 20A–27A, is also coupled to a tristate output buffer, 40–47, which drives the respective data, DO–D7, Q0–Q7, to 125 picoferard loads. Coupled to each output buffer, 40–47, is an output buffer enable line 50–57 for enabling and disabling a respective output buffer 40–47 (i.e., for switching the buffer from the tristate to an active low or active high state and visa versa.) Coupled to each output buffer enable line 50–57 is an enable line delay circuit 60–67, each of which is coupled to the delay enable line 14. Each enable line delay circuit 60–67 is coupled to a parallel output buffer enable line 18 which is derived from a buffer enable line 16 originating from internal logic of the chip. Each of the enable line delay circuits 60–67 is also serially coupled to one another by a series output buffer enable line 17 which is also derived from buffer enable line 16.

As mentioned earlier output buffers are toggled at basically two times. The first being when new data of a different logical level than the previous data is provided to the buffer. For instance, when an output buffer having previous low or logical "0" signal is changed to a high or a logical "1" signal. Spikes are caused by the resultant charging and discharging of output loads. The spikes are enlarged when all output buffers 40–47 are toggled simultaneously. What one aspect of the present invention does, in order to prevent the simultaneous toggling of the buffers, is to provide a delay circuit 30–37, respectively, in each of the data signal lines. The delay on each data signal line is slightly different than the other data signal lines so that no two buffers 40–47 receive new data signals simultaneously. In this way, no two buffers toggle simultaneously. (it is noted that one of the data signal line's delay can be a zero delay.) That is, the output buffers toggle in a staggered fashion, one after the other. Such staggering of the toggling of the output buffers 40–47 reduces the formation of voltage spikes on power supply lines.

In the present invention there is a uniform delay between the toggling of the output buffers. That is, the second buffer toggles after a predetermined time from when the first buffer toggled, and the third buffer toggles after approximately the same time from when the second buffer toggled, and so on. The amount of delay provided between buffer toggling is: (the longest allowable period of time given for a buffer to provide its output during a read cycle minus the fastest time the buffers can reliably toggle), divided by (the number of output buffers to be staggered minus 1). This yields the uniform amount of time which can be provided between the toggling of each buffer. For an eight pin data bus one need only seven delay elements (i.e. one delay can be a zero delay).

The total amount of delay provided to each data line is the sum total of the delay provided by the data signal line delay circuit plus the delay due to the line capacitance of the respective signal path. It is noted that in most instances each data signal path will have a different line length due to different routing requirements and, therefore, will have a different line capacitance and inherent delay. It is important, therefore, to determine the amount of delay due to a data signal line's line capacitance so that the delay added by the delay circuit will achieve the desired total delay. It is also important to note that there is no reason why DO must have the shortest delay and D1 the next shortest delay and D2 the next shortest, etc. What is important is that each data signal line 20–27 have a different total delay so that no two output buffers 40–47 toggle simultaneously.

Figure 2:
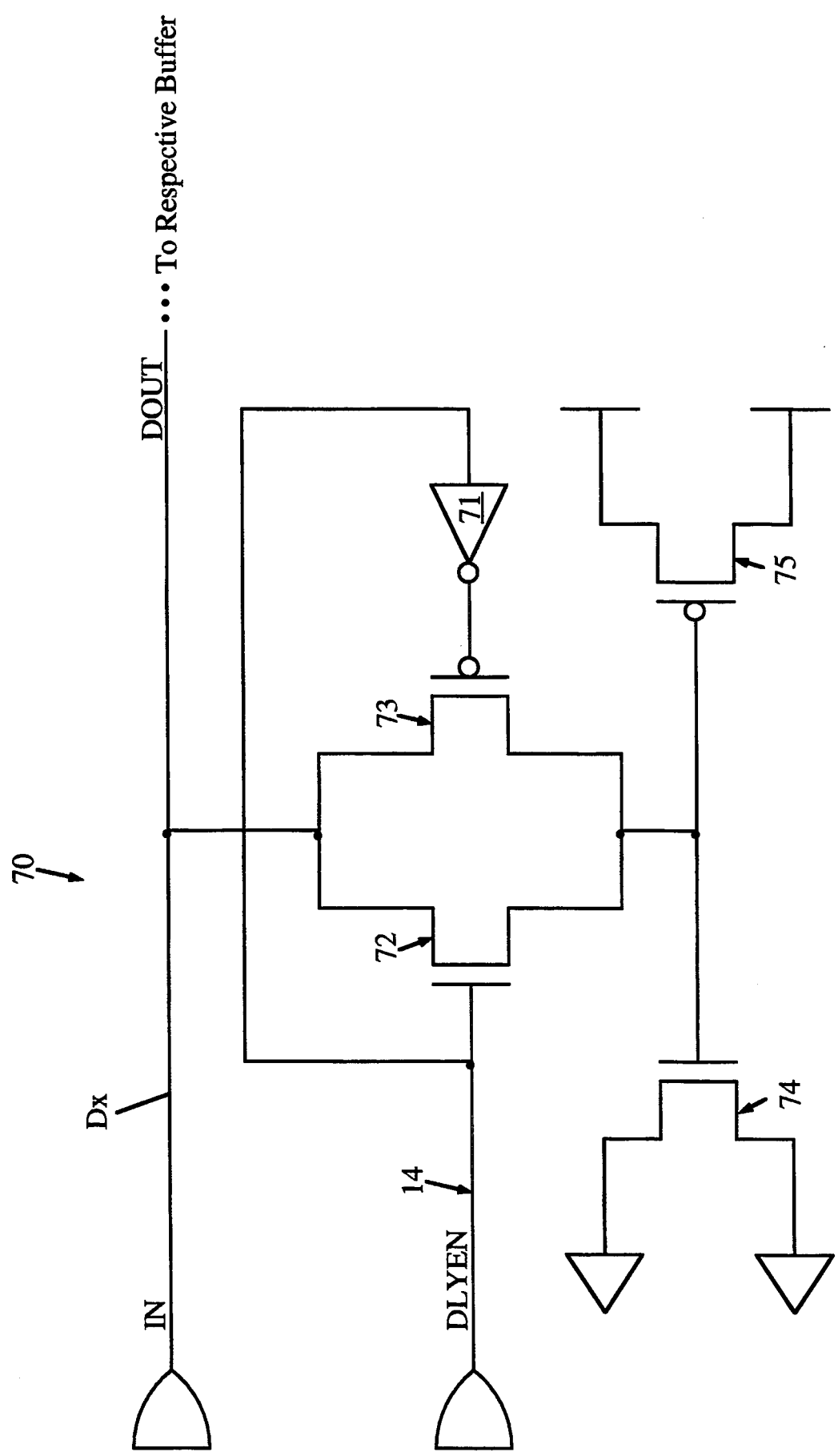
FIG. 2 is a data signal line delay circuit for a short delay.

In some instances only a short delay needs to be added to a data signal line to achieve the desired delay. In such a case a delay circuit as shown in FIG. 2 is quite useful. FIG. 2 illustrates a delay circuit 70 which can be utilized as a data delay circuit when a short delay is required. The delay circuit 70 is coupled to a respective data signal line $D_X$ ($D_X$ is one of the data lines DO–D7, 20–27). The delay enable line 14 is coupled to an inverter 71 and to a gate of an NMOS transistor 72. Inverter 71 is coupled to the gate of a PMOS transistor 73. The channel of PMOS and NMOS transistors 72 and 73, are coupled between the respective data line $D_X$ and a NMOS capacitor 74 and a PMOS capacitor 75.

When a delay is to be added to the data signal line, a high input is provided from the sensing circuit 15 to the data delay circuit 70 on delay enable signal line 14. This turns "on" transistors 72 and 73, respectively, which in turn couples capacitors 74 and 75 to the data signal path $D_X$. Therefore, before a data signal can propagate down the data signal line $D_X$, one of the capacitors 74 or 75 must be charged (i.e., NMOS capacitor 74 is charged for a high data signal, and PMOS capacitor 75 is charged for a low data signal). The charging of the capacitor provides the added delay. The amount of delay of a particular circuit is determined by the size of the capacitors 74 and 75 provided in the delay circuit 70.

When the staggering mode, or delay mode is to be disabled so that all buffers can be toggled simultaneously a low signal is provided to buffer 70 on delay enable signal line 14. A low signal turns "off" transistors 72 and 73 and decouples capacitors 74 and 75 from the data signal line $D_X$. In this way the respective data signal propagates down the data signal line without a delay due to the delay circuit 70. Thus the staggering mode of the staggered output circuit can be either enabled or disabled depending upon the environment the chip finds itself.

Figure 3:
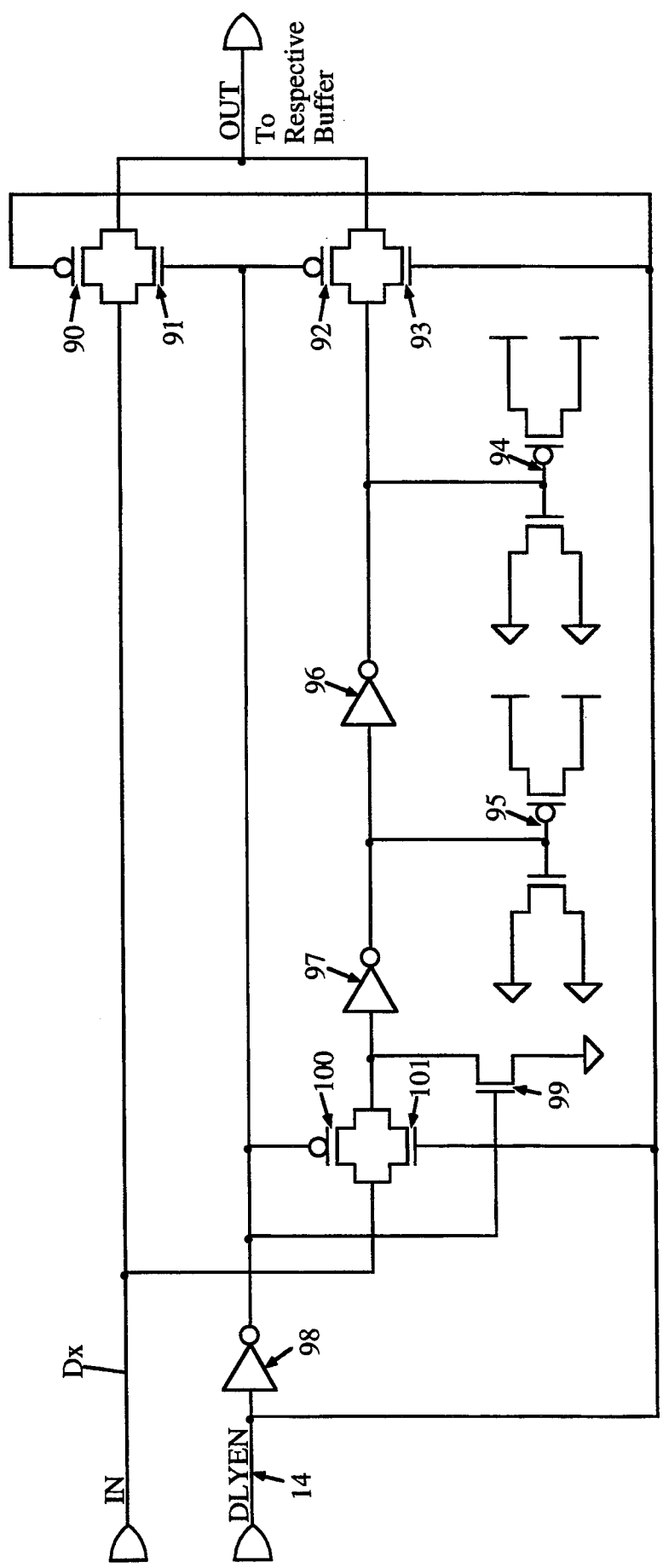
FIG. 3 is a data signal line delay circuit for a long delay.

When a long delay is required, for example in a situation where the data path is short and the respective output buffer is one which is to be toggled last, a delay circuit as shown in FIG. 3 is useful. The delay circuit shown in FIG. 3 is better suited for providing a larger delay than is the delay circuit shown in FIG. 2. When a delay is to be added, a high signal is provided on delay enable Line 14. This turns "on" NMOS transistors 93 and 101 and PMOS transistors 92 and 100, effectively coupling delay elements 95 and 94 to data bus $D_X$. The size of the delay elements 95 and 94 may be varied to provide different delays. When no delay is to be added a low signal on delay enable line 14 causes transistors 92, 93, 100, and 101 to turn "off" and NMOS transistor 91 and PMOS transistor 90 to turn "on". In this way a signal may propagate down signal line $D_X$ without an added delay.

It is to be stressed that many different delay circuits are well suited for the task. What is important is that each data signal line have a different total delay time (wherein one delay can be a zero delay) so that no two buffers receive new data signals at the same time, so that no two buffers toggle simultaneously. When no two buffers are toggled simultaneously, the resultant voltage spikes are small and do not cause significant reliability problems.

The second time when output buffers toggle simultaneously is when they become enabled or disabled. That is, when a tristate output buffer goes from the tristate to an enabled state of either logical high or logical low (and visa versa), the buffers toggle and cause spikes. Since all output buffers are normally enabled simultaneously, the present invention provides a different delay on each of the output buffer enable lines 50–57, so that no two output buffers become enabled or disabled simultaneously.

The tristate output buffers 40–47 are enabled and disabled by a buffer enable signal provided by internal logic of the chip. As shown in FIG. 1, the buffer enable signal line 16 provides the buffer enable signal from internal logic of the chip to the staggered output circuit of the present invention. The tristate buffers are enabled when a logical high state is provided on the enable line 16. The enable signal line 16 is provided to each enable delay circuit 60–67 by parallel output buffer enable line 18. Another enable line 17 serially couples the enable line delay circuits 60–67. The delay enable line 14 is also coupled to each of the enable line delay circuits 60–67.

Figure 4:
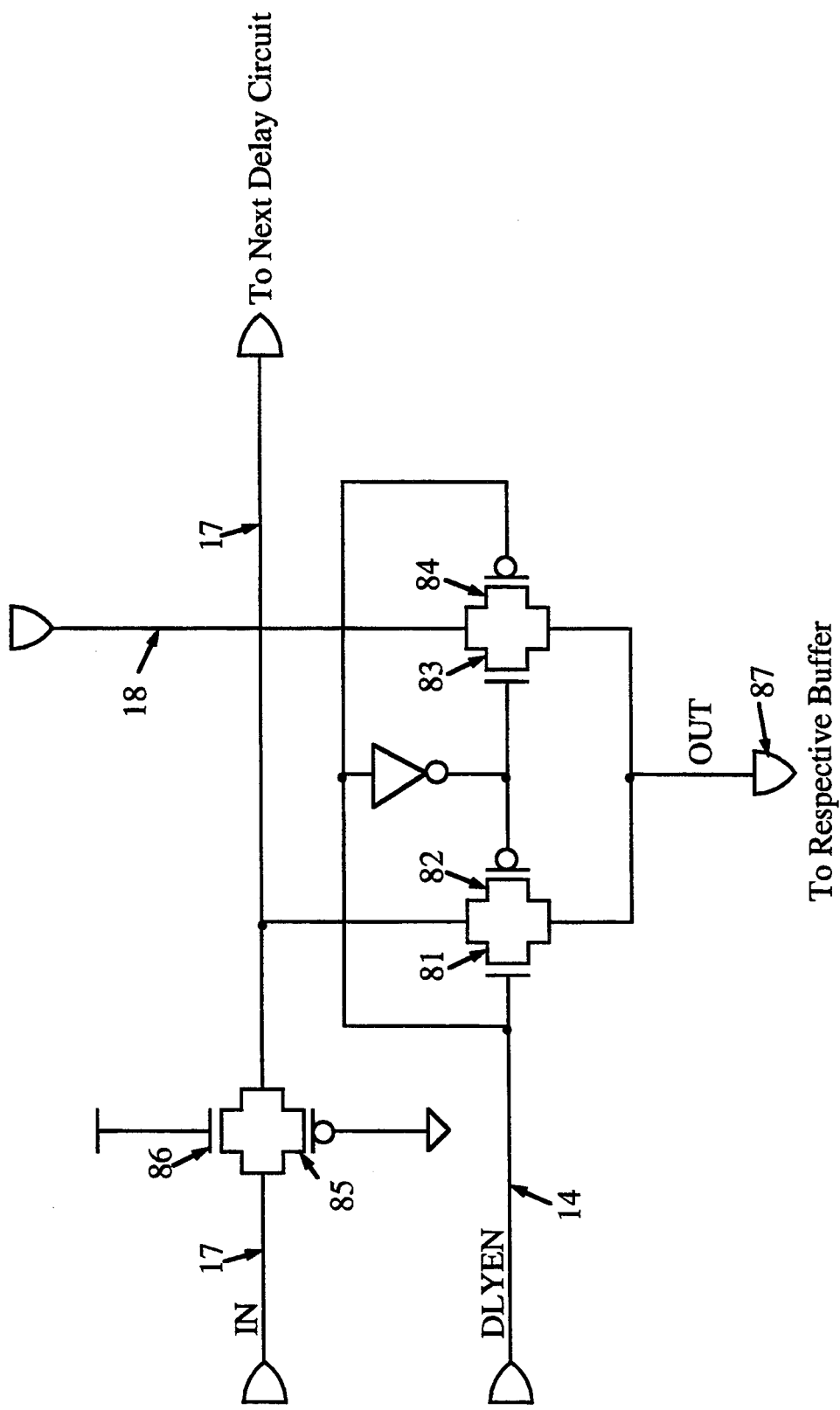
FIG. 4 is an enable line delay circuit.

When the output buffers are to be enabled a high signal is provided on output buffer enable line 16 to enable lines 17 and 18 to enable delay circuit 60. Enable delay circuit 60 is shown in FIG. 4. If a delay is to be provided to the enable signal, delay enable line 14 is high. A high signal on delay enable line 14 turns "on" transistors 81 and 82, and turns "off" transistors 83 and 84. The enable signal then propagates through conducting transistors 85 and 86 to the output 87, which is coupled to output buffer enable line 50. Conducting transistors 85 and 86 essentially provide a resistance R which coupled with the line capacitance of the enable signal line 17 provide an RC delay T0 for delay circuit 60. After delay T0 the enable signal propagates on output buffer enable line 50 to the output buffer 40 and propagates on series output buffer enable line 17 to the next enable delay circuit 61. The output buffer 40 toggles after a time T0 from when the enable signal lines 16 was turned high.

Enable delay circuit 61, like enable delay circuit 60 and like all of the enable delay circuits of the present invention, is shown in FIG. 4. Delay circuit 61 adds delay T1 to the enable signal it is provided on line 17. The total delay of the enable signal provided to output buffer 41 on output buffer enable line 51 is T0+T1. That is, output buffer 41 toggles after time T0+T1, or after time T1 from when output buffer 40 toggled. The enable signal is then similarly passed onto delay circuit 62 which adds a further delay of T2 to the enable signal, giving the enable signal provided to output buffer 42 on enable signal line 52 a total delay of T0+T1+T2. Thus, the total delay time before the toggling of output buffer 42 is T0+T1+T2, or time T2 after the toggling of buffer 41, and time T1+T2 after the toggling of buffer 40. The remaining buffers are enabled in the like fashion by coupling in series the enable line delay circuits to the enable signal line. In this manner no two output buffers become enabled simultaneously. That is, the tristate output buffers 40–47, are enabled (and disabled) in a staggered fashion, one after the other.

It is noted that instead of a series connection of the delay enable circuits 60–67 as used in the present invention, the enable lines 50–57 coupled to each output buffer can be coupled to delay circuits which provide varying delays. It is, however, easier to utilize eight similar circuits having the same type of delay coupled in series than it is to provide eight different delay circuits wherein each circuit provides a different delay.

The staggering mode, or delay mode, can be disabled so that all tristate buffers become enabled or disabled simultaneously. The staggering mode is disabled by proving a low signal on delay enable signal line 14 to each of the enable delay circuits 60–67. In reference to FIG. 4, a low signal on delay enable line 14 turns "off" transistors 81 and 82 and turns "on" transistors 83 and 84. In this way the output enable signal is provided from output enable signal line 16 to parallel output buffer enable line 18 to each of the respective output buffers. In this mode, each of the output buffers 40–47 is coupled in parallel to the enable signal line 16, so that each buffer becomes enabled or disabled simultaneously.

As mentioned in the background of the invention, another way of solving the voltage spike problem is to utilize a package having additional power supply pin pairs ($V_{SS}$ and $V_{CC}$ pairs). The present invention realizes this fact and provides a dual mode staggered output circuit. That is, if an integrated circuit utilizing the staggered output circuit is to be placed in a package which does not experience voltage spike problems (i.e., in a package having multiple power pin pairs), the staggering feature can be disabled and all buffers toggled simultaneously. A sensing circuit 15 determines which type of package the chip is being utilized in. If a pad 13, is bonded to $V_{CC}$ the sensing circuit 30 provides a "high" signal on delay enable signal line 14. The high signal enables each of the delay circuits 30–37 and 60–67 thereby implementing the staggered mode. If the integrated circuit implementing the present invention, is to be utilized in a package having multiple power pairs the staggering function can be disabled by not coupling the sensing circuit 15 to Vcc. In this way each of the delay circuits 30–37 and 60–67 is disabled and passes on its respective signal without providing a delay. The staggering mode is then disabled and all buffers toggle simultaneously.

A dual mode staggered output circuit has been described in detail. Such detail is not intended to limit the scope of the present invention. It is assumed that various features of the present invention, such as different delay circuits and the number of data lines, may be altered without varying from the scope of the present invention.

Thus, a novel method and apparatus has been described which eliminates voltage spikes on power supply lines of a die without slowing down the operating frequency of the circuit and without adding additional power pair pins to the package containing the die.

What is claimed is:

1. An apparatus for reducing noise spikes on voltage supply lines of an integrated circuit having a plurality of data signal lines each coupled to a respective tristate output buffer comprising:

a data delay circuit coupled to each of said data signal lines, wherein each of said data signal delay circuits provides a delay to its respective data signal line such that no two output buffers are toggled simultaneously;

an enable line delay circuit coupled to each of said tristate output buffers, said enable line delay circuits coupled in series with an enable signal line for enabling said tristate output buffers, said series connection of said enable delay circuits such that no two tristate output buffers become enabled simultaneously; and a sensing circuit coupled to said enable line delay circuits and to said data delay circuits, said sensing circuit for signaling to said enable delay circuits and to said data signal delay circuits whether or not said delay circuits are to provide delays to said respective signal lines.

2. The apparatus of claim 1 wherein said sensing circuit is coupled to a pad wherein said pad is bonded to Vcc to indicate to said sensing circuit that said enable delay circuits and said data signal delay circuits are to provide said delays.

3. The apparatus of claim 2 wherein the number of said plurality of data signal lines is eight.

* * * * *